United States Patent
Kaynak et al.

(10) Patent No.: US 11,689,217 B2
(45) Date of Patent: Jun. 27, 2023

(54) METHODS AND SYSTEMS OF STALL MITIGATION IN ITERATIVE DECODERS

(71) Applicant: Micron Technology, Inc., Boise, ID (US)

(72) Inventors: Mustafa N. Kaynak, San Diego, CA (US); Sivagnanam Parthasarathy, Carlsbad, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 17/223,804

(22) Filed: Apr. 6, 2021

(65) Prior Publication Data

US 2022/0321144 A1 Oct. 6, 2022

(51) Int. Cl.
*H03M 13/11* (2006.01)
*H03M 13/29* (2006.01)
*H03M 13/43* (2006.01)
*H03M 13/15* (2006.01)

(52) U.S. Cl.
CPC .... *H03M 13/1128* (2013.01); *H03M 13/1142* (2013.01); *H03M 13/2948* (2013.01); *H03M 13/1108* (2013.01); *H03M 13/1575* (2013.01); *H03M 13/43* (2013.01)

(58) Field of Classification Search
CPC ......... H03M 13/1128; H03M 13/2948; H03M 13/1142
See application file for complete search history.

(56) References Cited

U.S. PATENT DOCUMENTS

| | | | |
|---|---|---|---|
| 8,347,195 B1 * | 1/2013 | Varnica | H03M 13/1128 714/785 |
| 8,887,032 B1 * | 11/2014 | Varnica | G06F 11/076 714/780 |
| 9,564,922 B1 * | 2/2017 | Graumann | H03M 13/1142 |
| 11,146,290 B1 * | 10/2021 | Xiong | H03M 13/1111 |
| 2014/0164879 A1 * | 6/2014 | Tam | G06F 11/1012 714/773 |
| 2018/0115325 A1 * | 4/2018 | Blaettler | H03M 13/2951 |

* cited by examiner

*Primary Examiner* — Joseph D Torres
(74) *Attorney, Agent, or Firm* — Nicholson De Vos Webster & Elliott LLP

(57) ABSTRACT

Methods, systems, and apparatuses for stall mitigation in iterative decoders are described. A codeword is received from a memory device. The codeword is iteratively error corrected based on a first bit flipping criterion. A stall condition in the multiple error correction iterations is detected. In response to the detection, the codeword is error corrected based on a second bit flipping criterion that is different from the first bit flipping criterion.

20 Claims, 7 Drawing Sheets

FIG. 2B

Table 230A
For structures
200A and 200C

| Bit | Correct bit value | Bit read from memory | Current State of bit in 200A/200C | Channel Information | Energy Function in 200A/200C |
|---|---|---|---|---|---|
| 1 | 0 | 1 | 0 | -1 | 2-1-1=0 |
| 2 | 0 | 1 | 0 | -1 | 2-1-1=0 |
| 3 | 0 | 1 | 0 | -1 | 2-1-1=0 |
| 4 | 0 | 1 | 1 | 1 | 2-1+1=2 |
| 5 | 0 | 1 | 1 | 1 | 2-1+1=2 |
| 6 | 0 | 1 | 1 | 1 | 2-1+1=2 |

Table 230B
for Structure 200B

| Bit | Correct bit value | Bit read from memory | Current State of bit in 200B | Channel Information | Energy Function in 200B |
|---|---|---|---|---|---|
| 1 | 0 | 1 | 1 | 1 | 1-2+1=0 |
| 2 | 0 | 1 | 1 | 1 | 1-2+1=0 |
| 3 | 0 | 1 | 1 | 1 | 1-2+1=0 |
| 4 | 0 | 1 | 1 | 1 | 3+1=4 |
| 5 | 0 | 1 | 1 | 1 | 3+1=4 |
| 6 | 0 | 1 | 1 | 1 | 3+1=4 |

Table 230C
for Structure 200D

| Bit | Correct bit value | Bit read from memory | Current State of bit in 200D | Channel Information | Energy Function in 200D |
|---|---|---|---|---|---|
| 1 | 0 | 1 | 1 | 1 | -3+1=-2 |
| 2 | 0 | 1 | 1 | 1 | -3+1=-2 |
| 3 | 0 | 1 | 1 | 1 | -3+1=-2 |
| 4 | 0 | 1 | 0 | -1 | 2-1-1=0 |
| 5 | 0 | 1 | 0 | -1 | 2-1-1=0 |
| 6 | 0 | 1 | 0 | -1 | 2-1-1=0 |

FIG. 3
| Iteration | Syndrome Iteration Start | Syndrome Iteration End |
|---|---|---|
| 0 | 504 | 200 |
| 1 | 200 | 76 |
| 2 | 76 | 46 |
| 3 | 46 | 38 |
| 4 | 38 | 36 |
| 5 | 36 | 34 |
| 6 | 34 | 32 |
| 7 | 32 | 30 |
| 8 | 30 | 30 |
| 9 | 30 | 50 |
| 10 | 50 | 24 |
| 11 | 24 | 12 |
| 12 | 12 | 12 |
| 13 | 12 | 28 |
| 14 | 28 | 18 |
| 15 | 18 | 12 |
| 16 | 12 | 12 |
| 17 | 12 | 28 |
| 18 | 28 | 18 |
| 19 | 18 | 12 |
| 20 | 12 | 6 |
Stall pattern 302

METHODS AND SYSTEMS OF STALL MITIGATION IN ITERATIVE DECODERS

TECHNICAL FIELD

The present disclosure generally relates to error correction in memory subsystems, and more specifically, relates to methods and systems of stall mitigation in iterative decoders.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 3 illustrates a block diagram of an exemplary table including a stall pattern that is detected during error correction of a codeword, in accordance with some embodiments.

DETAILED DESCRIPTION

Figure 1:
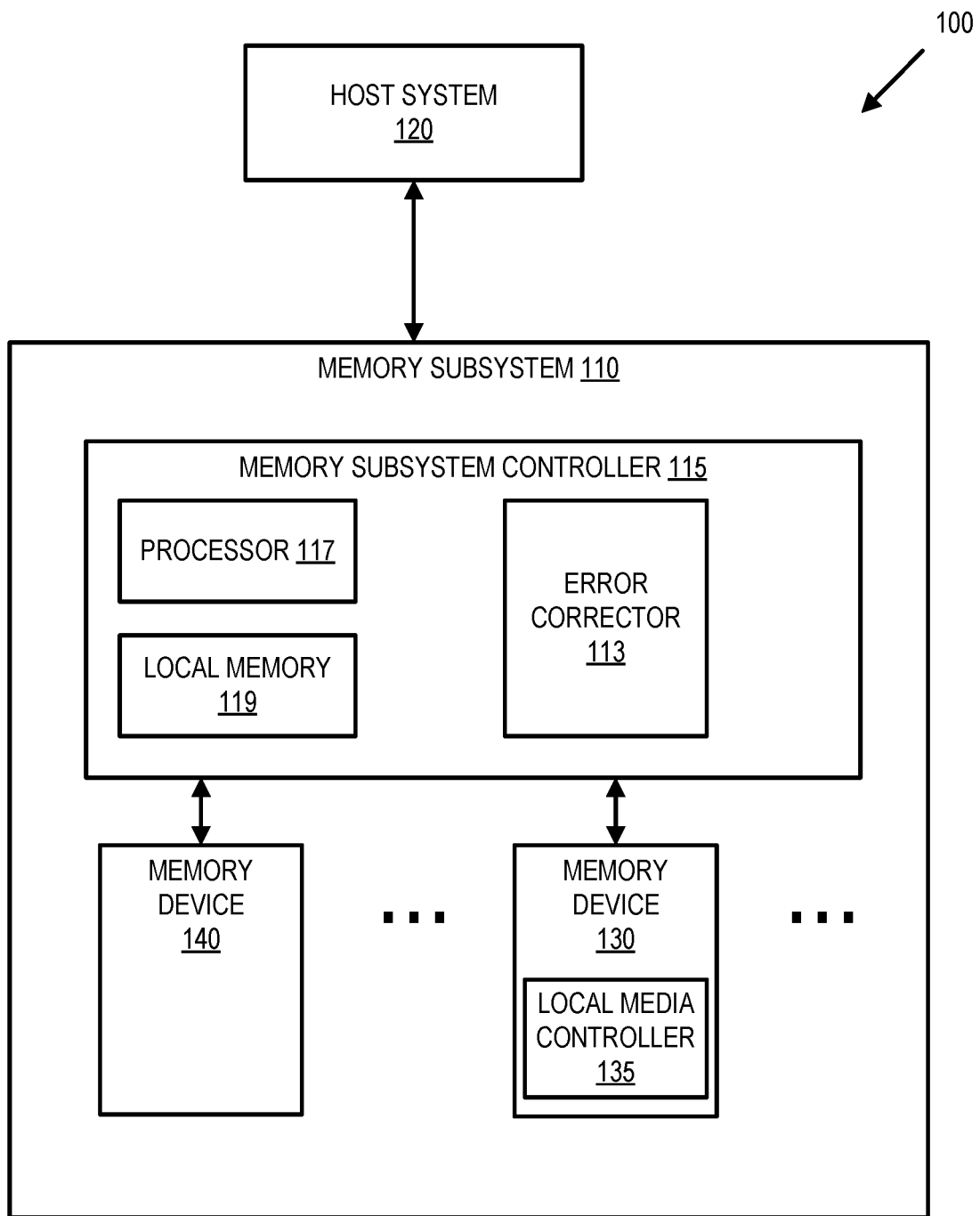
FIG. 1 illustrates an example computing system that includes a memory subsystem in accordance with some embodiments of the present disclosure.

Aspects of the present disclosure are directed to methods and systems of stall mitigation in iterative decoders of a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, a SLC can store one bit of information and has two logic states.

Low-Density Parity Check (LDPC) codes are commonly used for enabling error correction in memory subsystems. LDPC codes are a class of highly efficient linear block codes that include single parity check (SPC) codes. LDPC codes have a high error correction capability and can provide performance close to channel capacity. The MinSum algorithm (MSA), which is a simplified version of belief propagation algorithm, can be used for decoding LDPC codes. However, MSA-based decoders use a relatively high amount of energy per bit (pico-Joule per bit) for decoding codewords and hence are not well suited for energy conscious applications (such as mobile applications). Bit Flipping (BF) decoders have been introduced to address this problem. BF decoders use less energy per bit at the expense of providing lower error correction capability when compared to the error correction capability of MSA-based decoders. Lower error correction capability is an obstacle to the deployment of BF decoders for replacing MSA-based decoders. Further, a BF decoder may get stuck in a stall/oscillatory state, where additional iterations of the decoder do not enable the BF decoder to exit this stall state.

BF decoders define an energy function for a bit of a codeword. An energy function assigns an energy level to each codeword bit. An energy function of a codeword bit can be considered an indication of reliability information for the codeword bit. An energy function of a codeword bit can be determined based on a number of parity violations per codeword bit (e.g., a higher number of parity violations is a sign of less reliable bit) and channel information. The channel information is determined based on a current state of the bit (after one or more iterations of the BF decoder) versus the bit that was read from a memory device. When the current state of the bit agrees with the bit that was read from the memory device, the bit is considered to be more reliable. BF decoders flip least reliable bits first. The BF decoder is operative to maximize the energy function for each bit and reach global maxima, when a higher energy function corresponds to a more reliable bit. However, a BF decoder can get stuck at local maxima and fail to reach the global maxima. In this case the BF decoder starts oscillating between multiple states, i.e., for several consecutive iterations the decoder moves from one state to another with a period of iterations. The BF decoder oscillates between multiple states by repeating a stall pattern resulting in a high error floor.

An error floor is a phenomenon encountered in some iterated error correcting codes, such as LDPC codes. When the codeword error rate (CWER) or bit error ratio (BER) is plotted for an LDPC code, the CWER/BER steadily decreases in the form of a curve as the signal to noise ratio condition becomes better. CWER corresponds to the rate (probability) at which LDPC decoder fails to correct the errors in a codeword. For LDPC codes there is a point after which the curve does not fall as quickly as before, in other words, there is a region in which performance flattens. This region is called the error floor region. An error floor of a decoder is an indicator of performance of a subsystem using the decoder. For example, a BF decoder of a memory subsystem that has a high error floor affects Quality of Service (QoS) and latency of the memory subsystem. In fact, a BF decoder with a high error floor triggers error handling operations even when the raw bit error rate (RBER) is low, which results in worse QoS and higher latency.

Aspects of the present disclosure address the above and other deficiencies by improving BF decoders. The embodiments presented herein detect a stall condition in the multiple iterations of a BF decoder and modify the bit flipping criterion used to correct erroneous bits of a codeword. The embodiments described herein enable a decoder to exit a stall state. Further, the embodiments herein decrease the error floor of a BF decoder and significantly improve the performance of the memory subsystem.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes error corrector 113 that implements a method of stall mitigation. In some embodiments, the controller 115 includes at least a portion of the error corrector 113. For example, the controller 115 can include a processor 117 (processing device) configured to execute instructions stored in local memory 119 for performing the operations described herein. In some embodiments, an error corrector 113 is part of the host system 110, an application, or an operating system.

In some implementations, the error corrector 113 is operative to encode and decode data stored in the memory device (e.g., an encoder and/or decoder). Encoding data using an error correcting code (ECC) allows for correction of erroneous data bits when the data is retrieved from the memory device. For example, the error corrector 113 can encode data received from the host system 120 and store the data and parity bits as codewords in the memory device 130. The error corrector 113 can be further operative to decode data stored in the memory device 130 to identify and correct erroneous bits of the data before transmitting corrected data to the host system 120. Although illustrated as a single component that can perform encoding and decoding of data, the error corrector 113 can be provided as separate components. In some embodiments, the error corrector 113 is operative to encode data according to a Low-density parity-check (LDPC) code. The error corrector 113 is operative to decode the codewords stored in the memory device 130 based on a BF decoder. As described below, the error corrector 113 implements an enhanced BF decoder that can mitigate stalls of a decoding scheme.

The error corrector 113 receives a codeword from a memory device, e.g., memory device 130 or memory device 140, and attempts to correct the codeword in multiple iterations based on a first bit flipping criterion. In response to the error corrector 113 detecting a stall condition in the multiple iterations, the error corrector 113 attempts to correct the codeword based on a second bit flipping criterion that is different from the first bit flipping criterion. Further details with regard to the operations of the error corrector 113 are described below.

Figure 2:
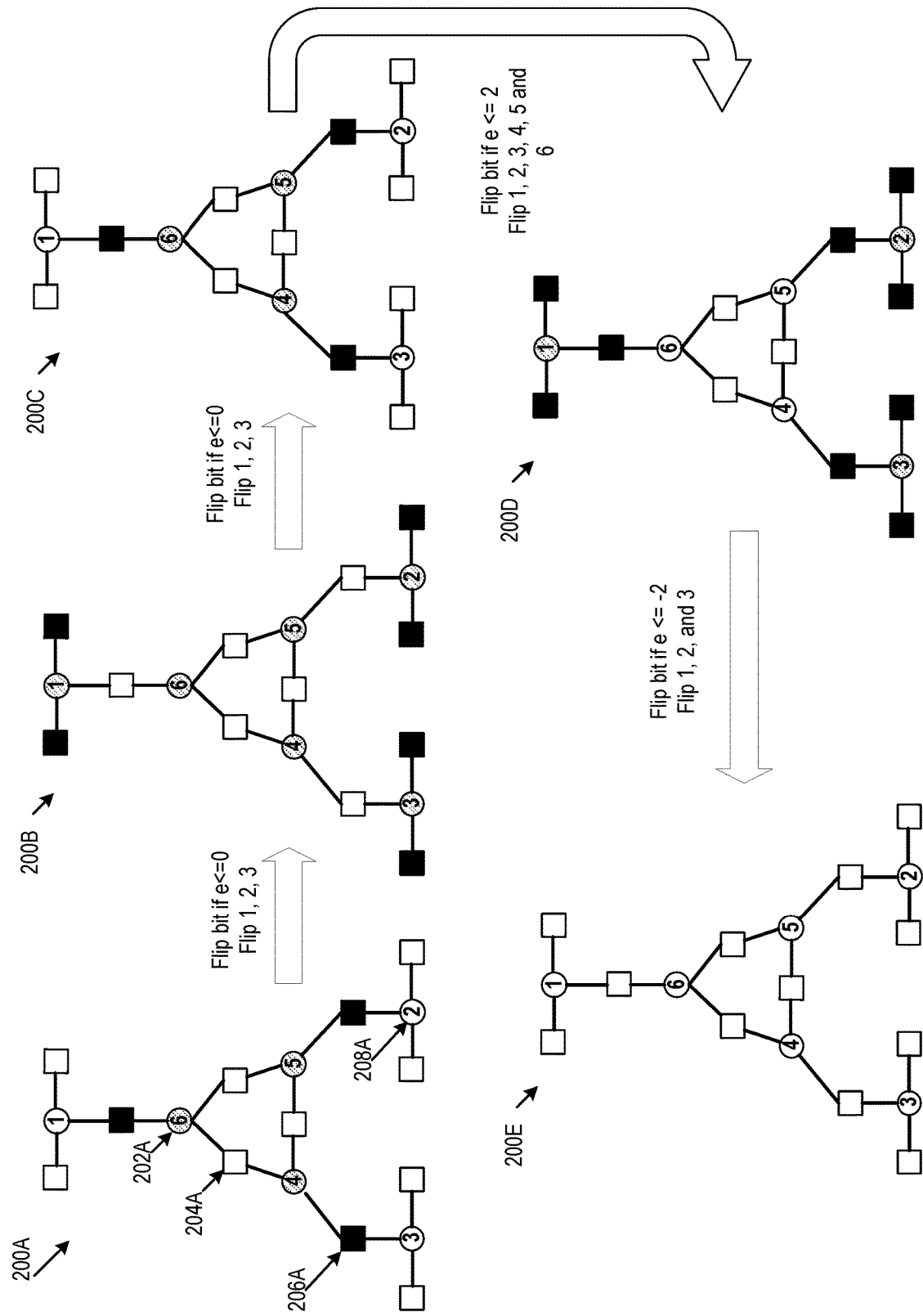
FIG. 2A illustrates a block diagram of an exemplary codeword structure that is error corrected based on the operations of an error corrector, in accordance with some embodiments of the present disclosure.
FIG. 2B illustrates a block diagram of exemplary values that bits of the codeword structure can take over multiple iterations of the error corrector, in accordance with some embodiments.

FIG. 2A illustrates a block diagram of an exemplary code structure 200 that is error corrected based on the operations of the error corrector 113, in accordance with some embodiments of the present disclosure. FIG. 2A shows multiple states of the same structure, e.g., states 200A, 200B, 200C, 200D, and 200E. A state of the structure includes an initial state or results from an iteration of the error corrector 113. The structure 200 is an exemplary structure that fails under traditional BF decoders (i.e., causes a traditional BF decoder to oscillate indefinitely). The structure 200 includes data bits and parity checks. The circles, e.g., circles 1, 2, 3, 4, 5 and 6, represent the data bits and the squares, e.g., square 204A and square 206A, represent parity checks. A shaded circle represents a bit in error, e.g., circles 4, 5, and 6 in state 200A, and a black square represents a failed (un-satisfied) parity check, whereas an unshaded circle represents a correct bit, e.g., circles 1, 2, 3 in state 200A, and an unshaded square represents a satisfied parity check, e.g., square 204A.

FIG. 2A will be described with the exemplary bit values of tables 230A-C from FIG. 2B. FIG. 2B illustrates a block diagram of exemplary values that bits of the structure 200 can take over multiple iterations of the error corrector 113, in accordance with some embodiments. The tables 230A, 230B, and 230C include column 231, column 232, and column 233 which include values that remain unchanged over the multiple iterations of the error corrector 113. Column 231 includes an identifier of the bits, 1, 2, 3, 4, 5, and 6. Column 232 includes the correct value of the bit. Column 233 includes the value of the bit as read from the memory device. Each of the tables 230A, 230B, and 230C includes a column that includes the current value of the bit after the latest iteration of the error correction, respectively columns 234A, 234B, and 234C. Each of the tables 230A, 230B, and 230C includes a column that includes a channel information for the bit, respectively columns 235A, 235B, and 235C, and a column that includes an energy function value of the bit, respectively columns 236A, 236B, and 236C.

To correct the errors, an error corrector 113 should flip bits 4, 5, and 6 which are in error. The error corrector 113 determines an energy function for each one of the bits (column 236A) and flips the bits according to the energy function and a bit flipping criterion. To determine the energy function for a bit, the error corrector 113 can determine channel information for a bit (column 235A), the number of satisfied parities for a bit, and the number of failed parities for the bit.

In some embodiments, the error corrector 113 determines a channel information for a bit according to the non-limiting example of equation (1):

$$\text{Channel information(bit)}=1-2*(\text{CurrentState(bit)} \text{XOR StateReadFromMemory(bit)}) \quad (1)$$

Where CurrentState(bit) is the state of the bit that results from the latest iteration of the error corrector 113 (column 234A) and the StateReadFromMemory(bit) is the state of the bit as read from memory (column 233A). According to equation (1), the channel information is 1 when the current state of the bit is equal to the state of the bit as read from memory, and the channel information is −1 when the current state of the bit is different from the state of the bit as read from memory.

The error corrector 113 determines the energy function based at least in part on the determined channel information. In a non-limiting example, an energy function can be determined according to equation (2):

$$e(\text{bit})=\text{NumberSatisfiedParities(bit)}-\text{NumberFailedParities(bit)}+\text{Channel information(bit)}) \quad (2)$$

In FIG. 2A, an initial bit flipping criterion (e.g., e(bit) is less than or equal to 0) results in flipping bits 1, 2, 3 and the state of the code structure moves from 200A to 200B, even though bits 1, 2, and 3 are correct and bits 4, 5, and 6 are in error. These are false flips. When the decoder (e.g., the error corrector 113) iterates to the code structure 200B, based on the energy function and the initial flipping criterion, decoder flips bits 1, 2, and 3 without flipping erroneous bits 4, 5, and 6. Structure 200C is obtained from this iteration, where structure 200C is identical to structure 200A and can cause the error corrector 113 to oscillate, repeating the decoding pattern that results in structures 200B-200C (a stall condition). Each of the error correction iterations illustrated in FIG. 2A, including the remediation of this stall condition, is described in additional detail below.

In the structure 200A, the bits 4, 5, and 6 are in error and bits 1, 2, and 3 are correct. Further, in structure 200A each of the bits 4, 5, and 6 is identical to its respective bit in the codeword as read from memory. There is a channel match between the current state of the bit and the bit read from memory for circles 4, 5, and 6. Bits 1, 2, and 3 are not in error but the bit read from memory disagrees with the current state of the bit, i.e., Bits 1, 2, and 3 were read in error from the memory device. There is a channel mismatch between the current state of the bit and the bit read from memory for bits 1, 2, and 3.

In a non-limiting example, the error corrector 113 determines the energy function for the bits 1, 2, 3, 4, 5, and 6 based on equation (2) and the values illustrated in FIG. 2B. In state 200A, each of the bits 1, 2, 3 have the same number of failed parities, 1, and the same number of satisfied parities, 2. Further, the channel information for each one of the bits 1, 2, and 3 is −1 as the current state of the bit disagrees with the state of the bit as read from memory. The energy function for each one of the bits of circles 1, 2, and 3 is e(1:3)=2−1−1=0 (column 236A). In structure 200A, the bits 4, 5, and 6 have the same number of satisfied parities, 2, and the same number of failed parities, 1 failed parity. The channel information for bits 4, 5, and 6 is 1 as the current state of the bit agrees with the state of the bit as read from memory. The energy function for bits 4, 5, and 6 is e(4:6) =2−1+1=2. Thus, while bits 4, 5, 6 are in error in structure 200A, the energy function of bits 1, 2, and 3 is lower than the energy function of bits 4, 5, and 6 indicating that bits 1, 2, and 3 are less reliable than bits 4, 5, and 6.

The error corrector 113 flips codeword bits 1, 2, and 3, which are not in error, based on an initial bit flipping criterion. The bit flipping criterion can be a bit flipping threshold. For example, the bit flipping threshold of 0 can be selected and the error corrector flips a bit when the energy function of the bit is less than or equal to the bit flipping threshold. According to the initial bit flipping criterion, the bits 4, 5, and 6, are perceived to be more reliable compared to bits 1, 2, and 3 even though bits 4, 5, and 6 are in error and bits 1, 2, and 3 are correct because the state of the bits 4, 5, and 6 are the same as what is read from memory resulting in their respective energy functions being greater than the bit flipping threshold. The result of the error corrector's iteration is structure 200B.

During a subsequent iteration, the error corrector 113 determines the energy function for bits 1, 2, 3, 4, 5 and 6, (e.g., column 236B where e(1:3)=1−2+1=0; e(4:6)=3+1=4). Based on these energy functions and the same first bit flipping criterion (e.g., bit flipping threshold of 0), the error corrector 113 flips bits 1, 2, and 3 again instead of flipping bits 4, 5, and 6 because the energy function for bits 1, 2, and 3 continues to indicate that it is less reliable than bits 4, 5, and 6 (e(1:3) is less than or equal to the bit flipping threshold, whereas e(4:6) is greater than the bit flipping threshold). Structure 200C is obtained from this iteration, where structure 200C is identical to structure 200A and can cause the error corrector 113 to oscillate, repeating the decoding pattern that results in structure 200B-200C (a stall condition).

The error corrector 113 detects this stall condition (as described herein) and modifies the bit flipping criterion. For example, the error corrector 113 modifies the bit flipping criterion by increasing the bit flipping threshold to 2 such that a bit with an energy function that is less than or equal to 2 is flipped. The bit flipping criteria is relaxed to flip more bits compared to the number of bits flipped based on the initial bit flipping criteria. The updated bit flipping criterion causes the bits 1, 2, 3, 4, 5 and 6 to be flipped and obtain an updated structure 200D. Thus, in this iteration (when the error corrector is operating on structure 200C) while the energy function of the bits has not changed, column 236A where e(1:3)=0 and e(4:6)=2, the modification of the bit flipping criterion (e.g., increase of the bit flipping threshold to 2) causes bits 1, 2, 3, 4, 5 and 6 to be flipped as they all satisfy the bit flipping criterion (e(1:3) is less than 2, e(4:6) is equal to 2). The iteration of the error corrector 113 results in the structure 200D.

During the following iteration, the error corrector 113 determines the energy functions for bits 1, 2, 3, 4, 5, and 6 for structure 200D. Each of the bits 1, 2, and 3 have 3 failed parities, no satisfied parities, and their current states agree with the state as read from memory resulting in a channel information of −1. The energy function of bits 1, 2, and 3 is e (1:3)=0−3+1=−2 (column 236C). Each of bits 4, 5, and 6 has 2 satisfied parities, 1 failed parities, and their current state disagrees with the bit as read from memory resulting in a channel information of −1. The energy function of each one of bits 4, 5, and 6 is e (4:6)=2−1−1=0. The error corrector 113 flips bit 1, 2, and 3, but not bits 4, 5, and 6 because the energy function of bits 1, 2, 3 satisfies the bit flipping criterion and the energy function of bits 4, 5, 6 does not satisfy the bit flipping criterion. In some embodiments, the bit flipping criterion used in this iteration, from structure 200D to structure 200E, is a further updated bit flipping criterion (e.g., threshold=−2). Structure 200E results from this iteration, where all parities are satisfied indicating that the bits 1, 2, 3, 4, 5 and 6 are corrected and the error corrector stops the iterations. In some embodiments, the error corrector 113 uses the updated bit flipping criterion for a limited number of iterations and the following iterations (e.g., from structure 200D to structure 200E) can be performed based on the initial bit flipping criterion instead of the updated bit flipping criterion or based on a further update bit flipping criterion. In other words, relaxing the bit flipping criteria for one or multiple iterations when the decoder is in stall condition helps the decoder to get out of the stall condition.

FIG. 3 illustrates a block diagram of an exemplary table including a stall pattern that is detected during error correction of a codeword, in accordance with some embodiments. The error corrector 113 decodes a codeword, attempting to correct errors for multiple iterations. As an example, the table 300 shows syndromes at the start and end of iterations of the error corrector 113. A syndrome indicates a number of erroneous parity checks in a codeword. At the initial iteration, 0, the syndrome at the start of the iteration is 504 and the syndrome at the end of the iteration is 200. The error corrector 113 performs a subsequent error correction iteration, iteration 1. At iteration 1, a syndrome iteration start is 200 and a syndrome iteration end is 76. In the example of FIG. 3 the decoder starts oscillating at iteration 12 and the period of oscillation is 4. The stall pattern 302 can be repeated a second time (from iteration 16 to iteration 19). Upon detecting the stall pattern 302, the error corrector 113 updates a bit flipping criterion, resulting in breaking out of the stall pattern at the end of iteration 20.

Figure 4:
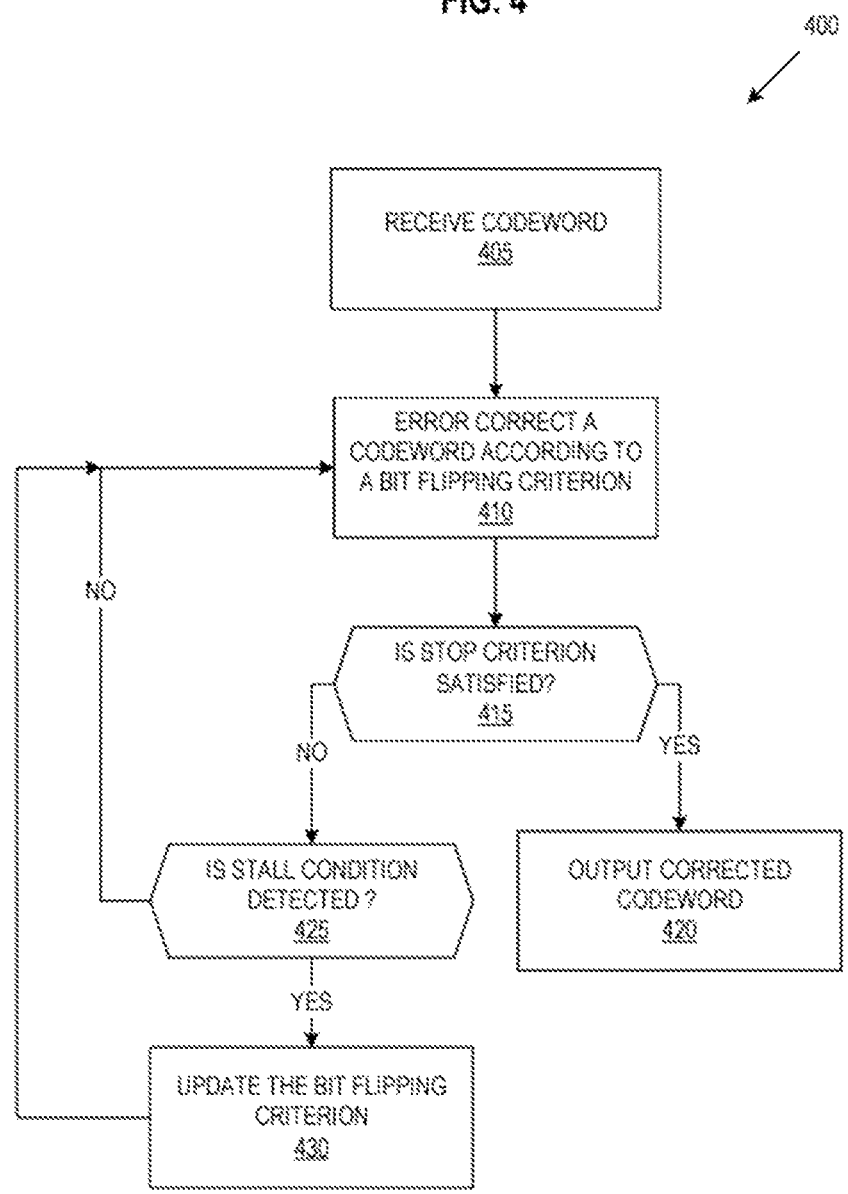
FIG. 4 is a flow diagram of an example method to enable stall mitigation in iterative decoders in accordance with some embodiments of the present disclosure.

FIG. 4 is a flow diagram of an example method 400 to mitigate stall in a decoder of a memory subsystem, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the error corrector 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible. The operations of the method 400 will be described with reference to the stall pattern of FIG. 3 as an exemplary stall pattern that can occur during error correction of a codeword. The illustrated embodiments should be understood only as examples, other stall patterns can occur.

At operation 405, the processing device receives a codeword from a memory device, e.g., memory device 130 or memory device 140. In some embodiments, the codeword is received as a result of a read operation from a host system 120. The codeword can include a combination of data bits and parity check bits. The parity check bits are stored in the memory device along with the data bits.

At operation 410, the processing device iteratively decodes the codeword by performing error correction of bits within the codeword for multiple iterations based on an initial bit flipping criterion. The processing device can perform an initial error correction iteration on the codeword to obtain an initial corrected codeword. For example, the processing device error corrects the codeword during iteration 0 of table 300. During an iteration, the processing device determines locations of potentially erroneous bits in the codeword and flips one or more of these bits to obtain an updated codeword (e.g., using an energy function and bit flipping criterion, as described above). The processing device calculates syndromes to determine the number of failed parities per codeword bits.

During the initial iteration, the processing device corrects errors of the codeword according to an initial bit flipping criterion. In some embodiments, the initial bit flipping criterion can include an initial bit flipping threshold. At an iteration that is performed based on the initial bit flipping criterion, the processing device flips one or more bits for the codeword that satisfy the initial bit flipping criterion. The processing device flips a bit when an energy function of the bit satisfied the bit flipping criterion. The energy function of the bit can be determined as described above. For example, at the initial iteration, the processing device flips one or more bits of the codeword received from the memory device, when the bits satisfy the bit flipping threshold. In some embodiments, a bit of the codeword satisfies the initial bit flipping threshold when the energy function of the bit is less than the initial bit flipping threshold. The processing device can perform several iterations based on the initial bit flipping criterion. Subsequent iterations can correct errors based on the updated codeword from a previous iteration. In the example of FIG. 3, the processing device can perform iterations 0 to 15 based on the initial bit flipping criterion. In some embodiments, the processing device can perform iterations 0 to 19 based on the initial bit flipping criterion.

At operation 415, the processing device determines whether a stop criterion is satisfied. A stop criterion can include an indication that no errors are detected for the codeword. In some embodiments, the stop criterion can include a null syndrome indicating that the codeword no longer include erroneous bits. In some embodiments, the stop criterion can include a maximum number of iterations or a maximum amount of time. For example, the processing device is operative to perform the maximum number of iterations (e.g., 30 iterations, 40 iterations, 100 iterations, etc.), and when this number of iterations is performed, the resulting corrected codeword is output, regardless of whether the corrected codeword still includes erroneous bits or not. When the stop criterion is satisfied, the flow of operations moves to operation 420. At operation 420, the processing device outputs the corrected codeword (or an indication of failure if the processing device was unable to decode the codeword). For example, the processing device can transmit the corrected codeword to the host 120. Alternatively, when the stop criterion is not satisfied, the flow of operations moves to operation 425.

At operation 425, the processing device determines if a stall condition is present in multiple iterations. In some embodiments, the processing device detects a stall condition by monitoring syndromes that result from the error correction of the codeword in the multiple iterations, and detecting a stall pattern, e.g., stall pattern 302, in the syndromes that result from the error correction of the codeword in consecutive iterations from the multiple iterations. For example, the processing device can store multiple consecutive syndromes generated during iterations of error correction of a codeword and compare successive sets of these syndromes to identify a stall pattern that repeats over multiple sets of iterations. The processing device can identify the stall pattern 302 as a repeating pattern between iterations 12-15 and iterations 16-19. In some embodiments, the processing device can detect the stall condition in multiple iterations by hashing multiple syndromes that result from the error correction of the codeword in the multiple iterations and comparing the hash value with a hash value resulting from hashing other syndromes resulting from the error correction of the codeword in other iterations. For example, the processing device can generate a hash value from the syndromes of iterations 12-15, and another hash value from the syndromes of iterations 16-19. The processing device compares the two hash values to determine that the iterations 12-15 and the iterations 16-19 have a similar pattern that is repeating.

In response to determining that the stall condition is not detected, the flow of operations moves to operation 410, at which the error correction of the codeword continues according to the iterative mechanism without updating the bit flipping criterion. The processing device corrects erroneous bits of the codeword based on the initial bit flipping criterion. Alternatively, in response to determining that the stall condition is detected, the flow of operations moves to operation 430.

At operation 430, the processing device updates the bit flipping criterion to an updated bit flipping criterion. In some embodiments, the updated bit flipping criterion can include an updated bit flipping threshold as described above. In some embodiments, the updated bit flipping threshold is greater than the initial bit flipping threshold, which relaxes the flipping conditions resulting in more bits flipped and enables the processing device to exit the stall condition. The flow of operations moves to operation 410, at which the processing device reiterates error correction of the codeword based on the updated bit flipping criterion.

At operation 410, following operation 430, the processing device error corrects the codeword based on the updated bit flipping criterion that is different from the initial bit flipping criterion. During an iteration that is performed based on the updated bit flipping criterion, the processing device flips one or more bits for the codeword that satisfy the updated bit flipping criterion. For example, the processing device flips one or more bits of the codeword, when the energy functions of the bits satisfy an updated bit flipping threshold. In some embodiments, the updated bit flipping threshold causes one or more reliable bits to be flipped, where the reliable bits were not flipped when the initial bit flipping criterion/threshold was used. In some embodiments, the updated bit flipping threshold causes more bits to be flipped than when the initial bit flipping threshold was used. In some embodiments, a bit of the codeword satisfies the updated bit flipping threshold when an energy function of the bit is less than or equal to the updated bit flipping threshold. The processing device can perform one or multiple iterations based on the updated bit flipping criterion. Subsequent iterations can correct errors based on the updated codeword from a previous iteration and further based on the updated bit flipping criterion.

In the example of FIG. 3, the processing device can perform iteration 20 based on the updated bit flipping criterion. While not illustrated in FIG. 3, additional iterations can be performed until a stop criterion is satisfied and a corrected codeword is output. While the embodiments herein describe an initial and an updated bit flipping criterion, in some embodiments, the bit flipping criterion can be updated multiple times (e.g., multiple increases of a bit flipping threshold, an increase followed with a decrease of the threshold, etc.). In one embodiment, the processing device can use the updated bit flipping criterion for one or more iterations before reverting back to the initial bit flipping criterion or further updating the bit flipping criterion (e.g., a threshold that is less than the initial bit flipping threshold and/or less than the updated bit flipping threshold, a threshold that is greater than the initial bit flipping threshold and/or greater than the updated bit flipping threshold). In another embodiment, the processing device can use the updated bit flipping criterion for one or more iterations before detecting another stall condition and further updating the bit flipping criterion.

Figure 5:
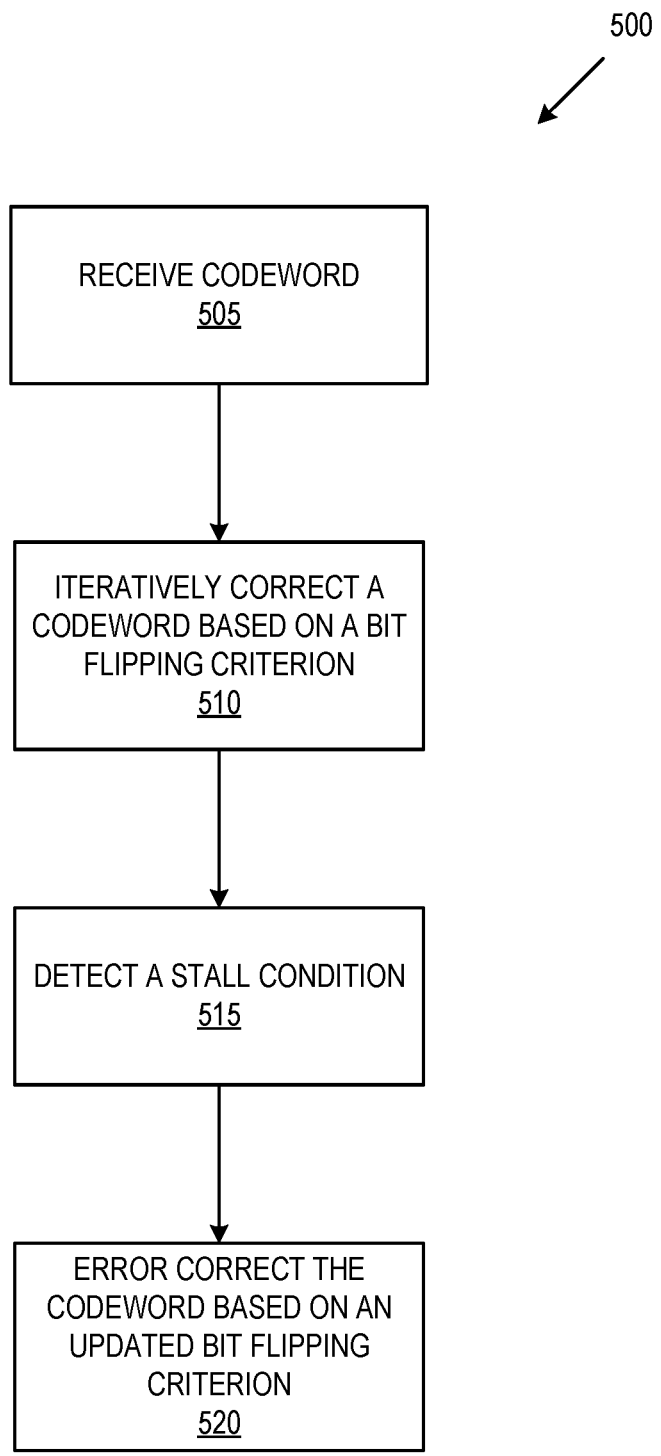
FIG. 5 is a flow diagram of another example method to enable stall mitigation in iterative decoders in accordance with some embodiments of the present disclosure.

FIG. 5 is a flow diagram of another example method to enable stall mitigation in iterative decoders in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the error corrector 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, the processing device receives a codeword from the memory device. At operation 510, the processing device iteratively error corrects the codeword in multiple iterations based on a first bit flipping criterion. In some embodiments, the error correction of the codeword in an iteration includes flipping one or more bits of the codeword that satisfy a bit flipping threshold as described above.

At operation 515, the processing devices detect a stall condition in the iterations. Detecting a stall condition can include detecting a stall pattern in syndromes that result from the error correction of the codeword in consecutive iterations from the multiple iterations. The detection of the stall condition can be performed as described above.

In response to the detection, the flow moves to operation 520. At operation 520, the processing device corrects errors of the codeword based on an updated bit flipping criterion that is different from the bit flipping criterion. In some embodiments, the updated bit flipping criterion causes one or more bits to be flipped, where the bits were not flipped when the first bit flipping criterion was used.

Figure 6:
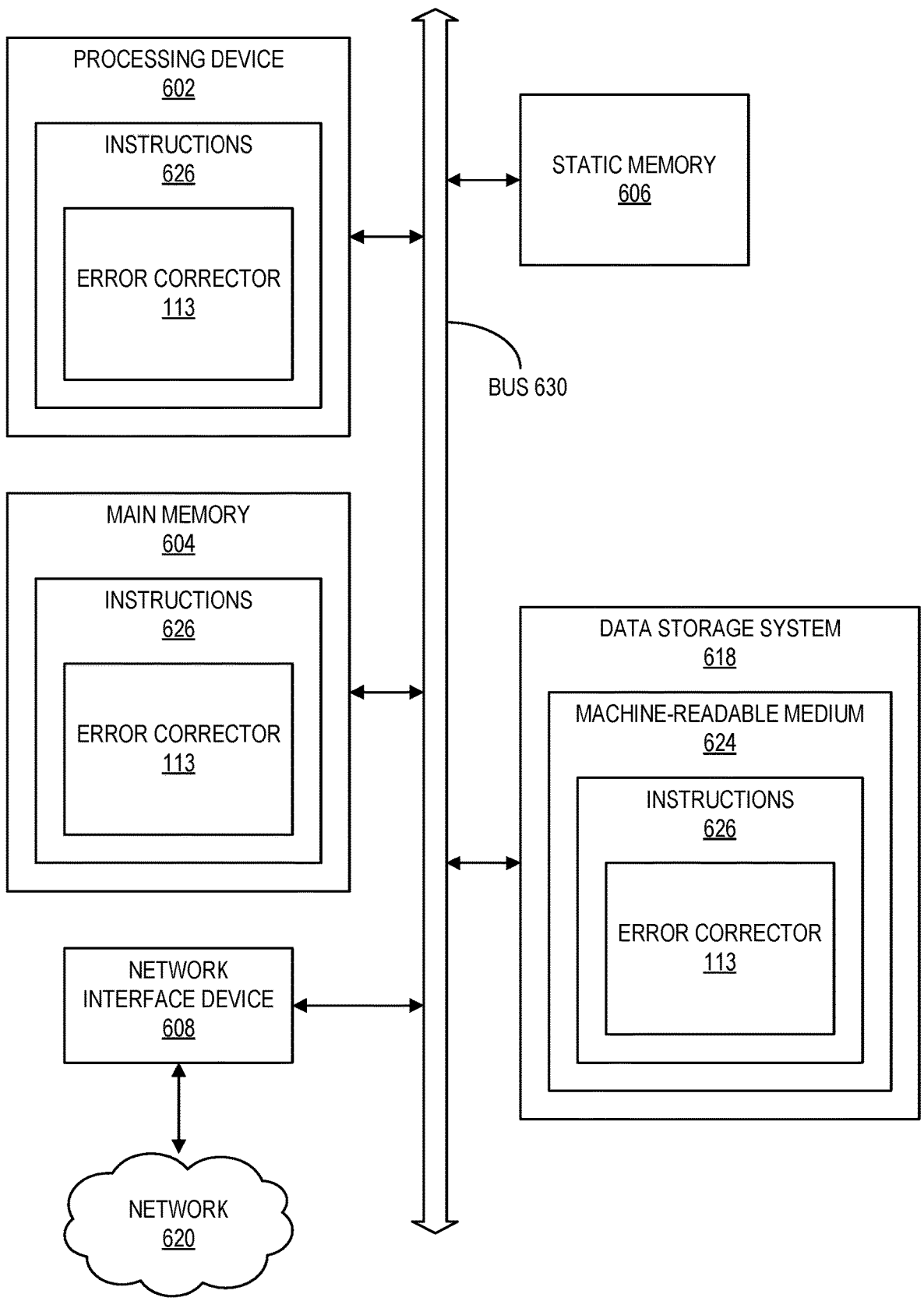
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the error corrector 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory subsystem 110 of FIG. 1.

In one embodiment, the instructions 626 include instructions to implement functionality corresponding to an error corrector (e.g., the error corrector 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, can carry out the computer-implemented methods 400 and 500 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
receiving a codeword comprising a plurality of bits from a memory device;
iteratively error correcting the codeword in a plurality of iterations based on a comparison between a first bit flipping criterion and an energy function of each of the plurality of bits of the codeword, wherein the first bit flipping criterion includes a first bit flipping threshold and wherein error correcting the codeword in an iteration of the plurality of iterations includes flipping one or more bits of the plurality of bits for the codeword that satisfy the first bit flipping threshold;
detecting a stall condition in the plurality of iterations; and
responsive to the detection, error correcting the codeword based on a comparison between a second bit flipping criterion and the energy function of each of the plurality of bits of the codeword, wherein the second bit flipping criterion includes a second bit flipping threshold and wherein the second bit flipping threshold is different from the first bit flipping threshold, wherein error correcting the codeword based on the second bit flipping threshold includes flipping one or more bits of the plurality of bits for the codeword that satisfy the second bit flipping threshold, wherein the second bit flipping threshold causes a bit to be flipped as a result of a comparison between the second bit flipping threshold and an energy function of the bit, wherein the bit was not flipped as a result of a comparison of the first bit flipping threshold and the energy function of the bit.

2. The method of claim 1, wherein the flipping of the bits for the codeword that satisfy the second bit flipping threshold includes:
determining that energy functions of the bits are less than the second bit flipping threshold.

3. The method of claim 1, wherein the detecting the stall condition includes:
monitoring syndromes that result from the error correction of the codeword in the plurality of iterations; and
detecting a stall pattern in syndromes that result from the error correction of the codeword in consecutive iterations from the plurality of iterations.

4. The method of claim 1, wherein the detecting the stall condition includes:
hashing syndromes that result from the error correction of the codeword in the plurality of iterations.

5. The method of claim 1, further comprising:
responsive to error correcting the codeword for a number of iterations using the second bit flipping threshold, error correcting the codeword using the first bit flipping threshold.

6. The method of claim 1, further comprising:
detecting a subsequent stall condition in the plurality of iterations; and
responsive to detecting the subsequent stall condition, error correcting the codeword based on a comparison between a third bit flipping criterion and the energy function of each of the plurality of bits of the codeword, wherein the third bit flipping criterion includes a third bit flipping threshold different from the first bit flipping threshold and the second bit flipping threshold.

7. The method of claim 6, wherein error correcting the codeword based on the third bit flipping threshold includes:
flipping one or more bits of the plurality of bits for the codeword that satisfy the third bit flipping threshold, wherein satisfying the third bit flipping threshold includes determining that energy functions of the bits are less than the third bit flipping threshold.

8. A non-transitory computer-readable storage medium comprising instructions that, when executed by a processing device, cause the processing device to:
receive a codeword comprising a plurality of bits from a memory device;
iteratively error correct the codeword in a plurality of iterations based on a comparison between a first bit flipping criterion and an energy function of each of the plurality of bits of the codeword, wherein the first bit flipping criterion includes a first bit flipping threshold and wherein error correcting the codeword in an iteration of the plurality of iterations includes flipping one or more bits of the plurality of bits for the codeword that satisfy the first bit flipping threshold;
detect a stall condition in the plurality of iterations; and
responsive to the detection, error correct the codeword based on a comparison between a second bit flipping criterion and the energy function of each of the plurality of bits of the codeword, wherein the second bit flipping criterion includes a second bit flipping threshold and wherein the second bit flipping threshold is different from the first bit flipping threshold, wherein error correcting the codeword based on the second bit flipping threshold includes flipping one or more bits of the plurality of bits for the codeword that satisfy the second bit flipping threshold, wherein the second bit flipping threshold causes a bit to be flipped as a result of a comparison between the second bit flipping threshold and an energy function of the bit, wherein the bit was not flipped as a result of a comparison of the first bit flipping threshold and the energy function of the bit.

9. The non-transitory computer-readable storage medium of claim 8, wherein the flipping of the bits for the codeword that satisfy the second bit flipping threshold includes:

determining that energy functions of the bits are less than the second bit flipping threshold.

10. The non-transitory computer-readable storage medium of claim 8, wherein to detect the stall condition includes to:
monitor syndromes that result from the error correction of the codeword in the plurality of iterations; and
detect a stall pattern in syndromes that result from the error correction of the codeword in consecutive iterations from the plurality of iterations.

11. The non-transitory computer-readable storage medium of claim 8, wherein to detect the stall condition includes to:
hash syndromes that result from the error correction of the codeword in the plurality of iterations.

12. The non-transitory computer-readable storage medium of claim 8, wherein the processing device is further to:
responsive to error correcting the codeword for a number of iterations using the second bit flipping threshold, error correct the codeword using the first bit flipping threshold.

13. The non-transitory computer-readable storage medium of claim 8, wherein the processing device is further to:
detect a subsequent stall condition in the plurality of iterations; and
responsive to detecting the subsequent stall condition, error correct the codeword based on a comparison between a third bit flipping criterion and the energy function of each of the plurality of bits of the codeword, wherein the third bit flipping criterion includes a third bit flipping threshold different from the first bit flipping threshold and the second bit flipping threshold.

14. The non-transitory computer-readable storage medium of claim 13, wherein to error correct the codeword based on the third bit flipping threshold includes to:
flip one or more bits of the plurality of bits for the codeword that satisfy the third bit flipping threshold, wherein satisfying the third bit flipping threshold includes determining that energy functions of the bits are less than the third bit flipping threshold.

15. A system comprising:
a memory device; and
a processing device, operatively coupled with the memory device, to:
receive a codeword comprising a plurality of bits from the memory device;
iteratively error correct the codeword in a plurality of iterations based on a comparison between a first bit flipping threshold and an energy function of each of the plurality of bits of the codeword, wherein the error correction of the codeword in an iteration from the plurality of iterations includes flipping one or more bits of the plurality of bits for the codeword that satisfy the first bit flipping threshold;
detect a stall condition in the plurality of iterations; and
responsive to the detection, error correct the codeword based on a comparison between a second bit flipping threshold and the energy function of each of the plurality of bits of the codeword, wherein the second bit flipping threshold is different from the first bit flipping threshold, wherein error correcting the codeword based on the second bit flipping threshold includes flipping one or more bits of the plurality of bits for the codeword that satisfy the second bit flipping threshold, wherein the second bit flipping threshold causes a bit to be flipped as a result of a comparison between the second bit flipping threshold and an energy function of the bit, wherein the bit was not flipped as a result of a comparison of the first bit flipping threshold and the energy function of the bit.

16. The system of claim 15, wherein the flipping of the bits for the codeword that satisfy the second bit flipping threshold includes:
determining that energy functions of the bits are less than the second bit flipping threshold.

17. The system of claim 15, wherein to detect the stall condition includes to:
monitor syndromes that result from the error correction of the codeword in the plurality of iterations; and
detect a stall pattern in syndromes that result from the error correction of the codeword in consecutive iterations from the plurality of iterations.

18. The system of claim 15, wherein to detect the stall condition includes to:
hash syndromes that result from the error correction of the codeword in the plurality of iterations.

19. The system of claim 15, wherein the processing device is further to:
responsive to error correcting the codeword for a number of iterations using the second bit flipping threshold, error correct the codeword using the first bit flipping threshold.

20. The system of claim 15, wherein the processing device is further to:
detect a subsequent stall condition in the plurality of iterations; and
responsive to detecting the subsequent stall condition, error correct the codeword based on a comparison between a third bit flipping criterion and the energy function of each of the plurality of bits of the codeword, wherein the third bit flipping criterion includes a third bit flipping threshold different from the first bit flipping threshold and the second bit flipping threshold.

* * * * *